(12) United States Patent
Zhang et al.

(10) Patent No.: US 9,564,512 B2
(45) Date of Patent: Feb. 7, 2017

(54) FIN FIELD-EFFECT TRANSISTOR AND FABRICATION METHOD THEREOF

(71) Applicant: Semiconductor Manufacturing International (Shanghai) Corporation, Shanghai (CN)

(72) Inventors: Haiyang Zhang, Shanghai (CN); Chenglong Zhang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/059,434

(22) Filed: Mar. 3, 2016

(65) Prior Publication Data

US 2016/0293727 A1  Oct. 6, 2016

(30) Foreign Application Priority Data

Mar. 31, 2015 (CN) .......................... 2015 1 0149625

(51) Int. Cl.

| | |
|---|---|
| H01L 21/8234 | (2006.01) |
| H01L 29/66 | (2006.01) |
| H01L 21/265 | (2006.01) |
| H01L 21/3213 | (2006.01) |
| H01L 21/3105 | (2006.01) |
| H01L 29/51 | (2006.01) |
| H01L 29/49 | (2006.01) |

(Continued)

(52) U.S. Cl.
CPC ....... *H01L 29/66545* (2013.01); *H01L 21/265* (2013.01); *H01L 21/283* (2013.01); *H01L 21/31* (2013.01); *H01L 21/31056* (2013.01); *H01L 21/32135* (2013.01); *H01L 29/495* (2013.01); *H01L 29/517* (2013.01); *H01L 29/66628* (2013.01); *H01L 29/66795* (2013.01)

(58) Field of Classification Search
CPC .................... H01L 29/66545; H01L 29/66795; H01L 21/265; H01L 21/32135; H01L 21/31056; H01L 29/517; H01L 29/495; H01L 21/31; H01L 21/283; H01L 29/66628

See application file for complete search history.

(56) References Cited

U.S. PATENT DOCUMENTS 9,082,788 B2 *  7/2015  Loubet .............. H01L 29/66484
9,171,927 B2 * 10/2015  Mehta ................. H01L 29/6653

(Continued)

*Primary Examiner* — Savitr Mulpuri
(74) *Attorney, Agent, or Firm* — Anova Law Group, PLLC

(57) ABSTRACT

A method for fabricating a FinFET structure comprises providing a semiconductor substrate; forming a hard mask layer on the semiconductor substrate; forming a dummy gate structure having a dummy gate, a first sidewall spacer and a second sidewall spacer; removing the dummy gate to form a first trench; forming first sub-fins in the semiconductor substrate under the hard mask layer in the first trench; forming a first metal gate structure in the first trench; removing the first sidewall spacer to form a second trench; forming second sub-fins in the semiconductor substrate under the hard mask layer in the second trench; forming a second metal gate structure in the second trench; removing the second sidewall spacer to form a third trench; forming third sub-fins in the semiconductor substrate under the hard mask layer in the third trench; and forming a third metal gate structure in the third trench.

10 Claims, 15 Drawing Sheets

(51) Int. Cl.
*H01L 21/31* (2006.01)
*H01L 21/283* (2006.01)

(56) References Cited

U.S. PATENT DOCUMENTS

| | | | |
|---|---|---|---|
| 9,331,077 B2* | 5/2016 | Matsumoto | H01L 21/82381 |
| 9,437,436 B2* | 9/2016 | Jagannathan | H01L 21/28132 |
| 2016/0111368 A1* | 4/2016 | Zhang | H01L 23/5283 |
| | | | 257/762 |

* cited by examiner

FIN FIELD-EFFECT TRANSISTOR AND FABRICATION METHOD THEREOF

CROSS-REFERENCES TO RELATED APPLICATIONS

This application claims the priority of Chinese patent application No. 201510149625.9, filed on Mar. 31, 2015, the entirety of which is incorporated herein by reference.

FIELD OF THE INVENTION

The present invention generally relates to the field of semiconductor manufacturing technology and, more particularly, relates to fin field-effect transistors and fabrication processes thereof.

BACKGROUND

With the continuous development of semiconductor technology, the technical node has gradually decreased; and the gate-last technology has been widely used in order to obtain desired threshold voltage, and improve the performance of the device. However, when the critical dimension of semiconductor device is further reduced, the structure of the conventional MOS field-effect transistor is unable to satisfy the performance needs of the semiconductor devices even with the use of the gate-last technology. Therefore, as multi-gate devices, fin field-effect transistors (FinFETs) have attracted extensive attentions.

FIG. 1 illustrates a three-dimensional view of an existing FinFET structure. As illustrated in FIG. 1, the FinFET structure includes a semiconductor substrate 10, and a plurality of protruding fins 20 formed on the semiconductor substrate 10. The plurality of fins 20 are usually formed by etching the semiconductor substrate 10. The FinFET structure also includes a dielectric layer 30 covering the surface of the semiconductor substrate 10 and portions of the side surfaces of the plurality of fins 20.

Further, the FinFET structure includes a gate structure (not labeled) crossing over the plurality of fins 20. The gate structure covers portions of the side and the top surfaces of the plurality of fins 20. The gate structure includes a gate dielectric layer 41 and a gate 42 formed on the gate dielectric layer 41. For a FinFET, the top portion and the side portions of the fins 20 contacting with the gate structure become the channel region. That is, the FinFET has a multiple gate structure. The multiple-gate structure is in favor of increasing drive current, and improving the performance of the semiconductor device. Further, the gate structure is able to cross over one or more fins simultaneously.

However, the performance of the existing FinFETs may need further improvements. The disclosed device structures and methods are directed to solve one or more problems set forth above and other problems.

BRIEF SUMMARY OF THE DISCLOSURE

One aspect of the present disclosure includes providing a method for fabricating a Fin field-effect transistor structure. The method includes providing a semiconductor substrate; and forming a hard mask layer on the semiconductor substrate. The method also includes forming a dummy gate structure having a dummy gate, a first sidewall spacer and a second sidewall spacer on two side surfaces of the dummy gate crossing over the hard mask layer on the semiconductor substrate. Further, the method includes removing the dummy gate to form a first trench to expose the hard mask layer; forming first sub-fins in the semiconductor substrate under the hard mask layer in the first trench; and forming a first metal gate structure in the first trench. Further, the method also includes removing the first sidewall spacer to form a second trench to expose the hard mask layer; forming second sub-fins in the semiconductor substrate under the hard mask layer in the second trench; and forming a second metal gate structure in the second trench. Further, the method also includes removing the second sidewall spacer to form a third trench to expose the hard mask layer; forming third sub-fins in the semiconductor substrate under the hard mask layer in the third trench; and forming a third metal gate structure in the second trench.

Another aspect of the present disclosure includes providing a Fin field-effect transistor structure. The Fin field-effect transistor structure includes a semiconductor substrate; and a plurality of fins formed on a surface of the semiconductor substrate. The Fin field-effect transistor structure also includes a hard mask layer having a plurality of long stripes formed on top surfaces of the plurality of fins; and a metal gate structure having a first gate structure, a second gate structure and a third gate structure covering side surfaces of the plurality of fins and top and side surfaces of the long stripes of the hard mask layer. Wherein the first gate structure, the second gate structure and the third gate structure have different work functions. Further, the Fin field-effect transistor structure also includes a dielectric layer covering side surfaces of the hard mask layer and the metal gate structure formed over the surface of the semiconductor substrate.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
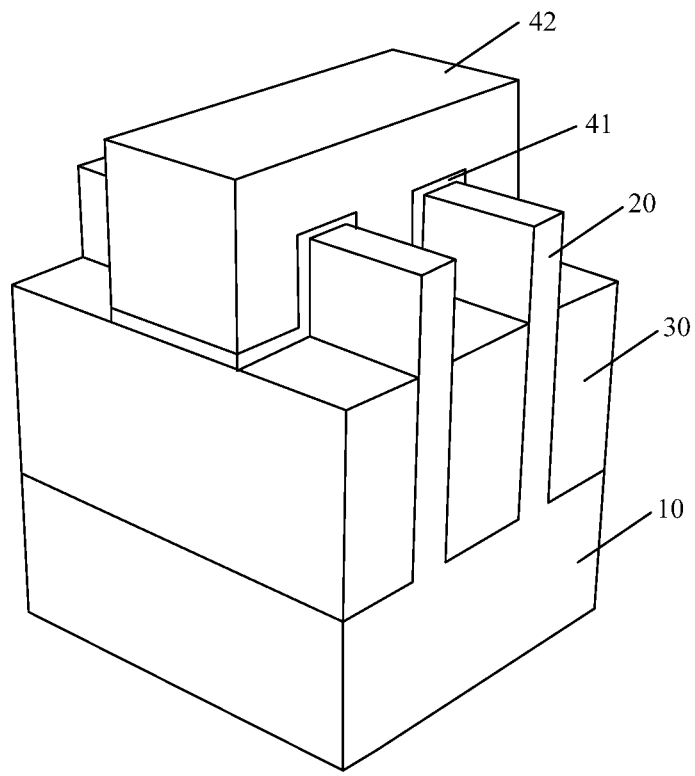
FIG. 1 illustrates an existing FinFET structure.

Referring to FIG. 1, the gate structure of FinFET includes the gate dielectric layer 41 and the gate 42 formed on top of the gate dielectric layer 41. The gate dielectric layer 41 is usually made of high-K dielectric material, such as hafnium oxide, zirconia, lanthanum oxide, or aluminum oxide, etc. The gate 42 is usually made of metal material, such as tungsten, gold, aluminum, or silver, etc. The gate 42 is usually made of one metal material. Thus, the value of the work function may be limited; and the control ability of the gate structure to the channel region may be not enough. Thus, the punch-through source-drain leakage current may occur frequently in the FinFET.

Further, the performance of the FinFET at high frequencies may need further improvements. According to the disclosed embodiments, the control ability of the metal gate structure to the channel region and the performance FinFETs may be improved by forming multiple metal gate structures with different work-functions.

Figure 28:
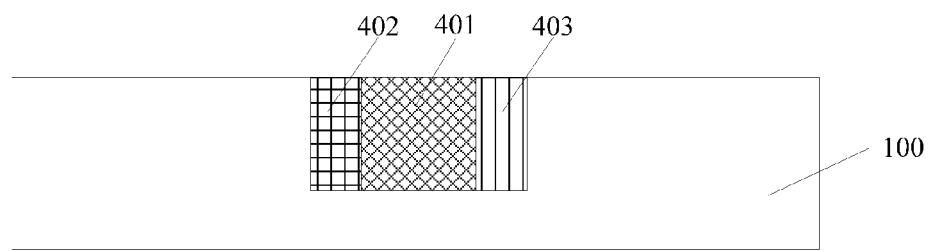
Figure 29:
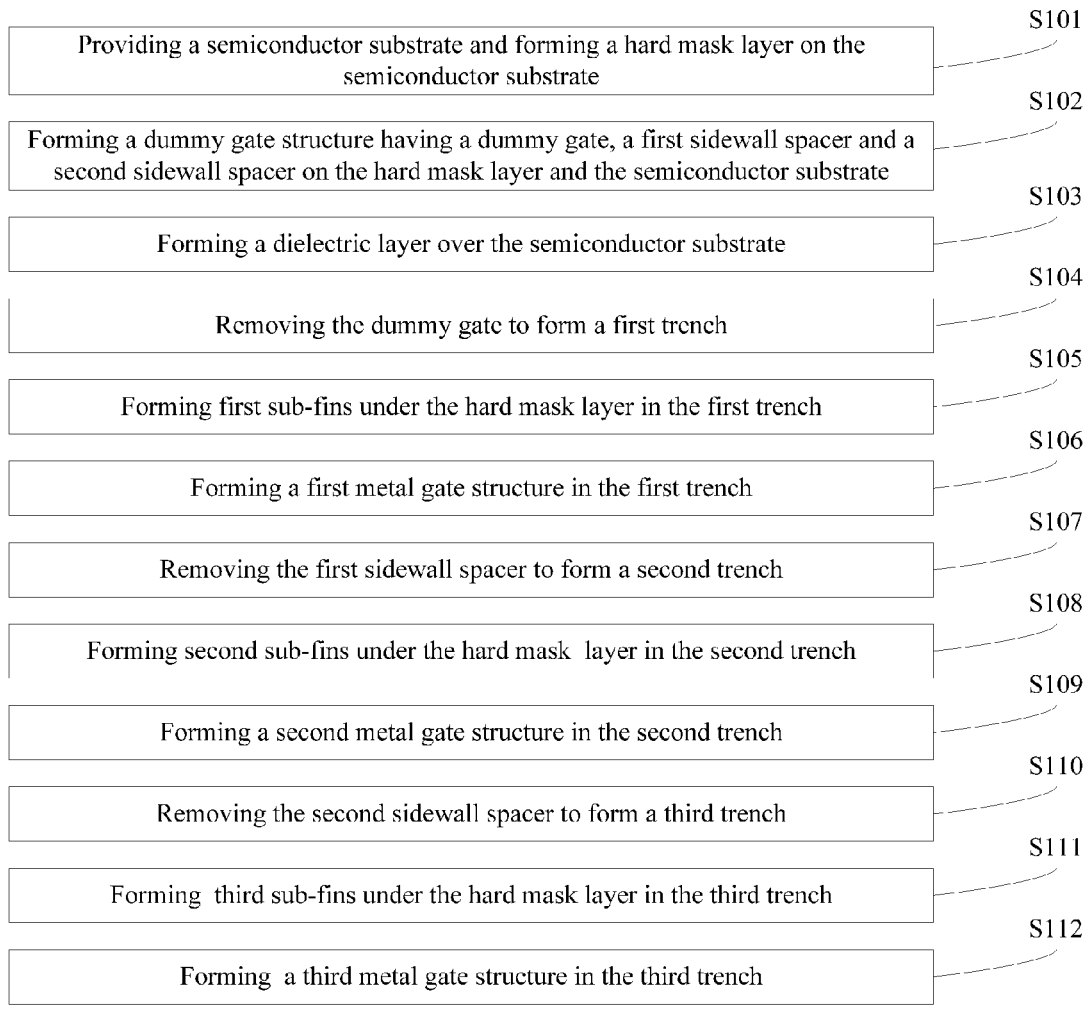
FIG. 29 illustrates an exemplary fabrication process of a FinFET structure consistent with the disclosed embodiments.

FIG. 29 illustrates an exemplary fabrication process of a FinFET structure consistent with the disclosed embodiments; and FIGS. 2~28 illustrate semiconductor structures corresponding to certain stages of the exemplary fabrication process.

Figure 2:
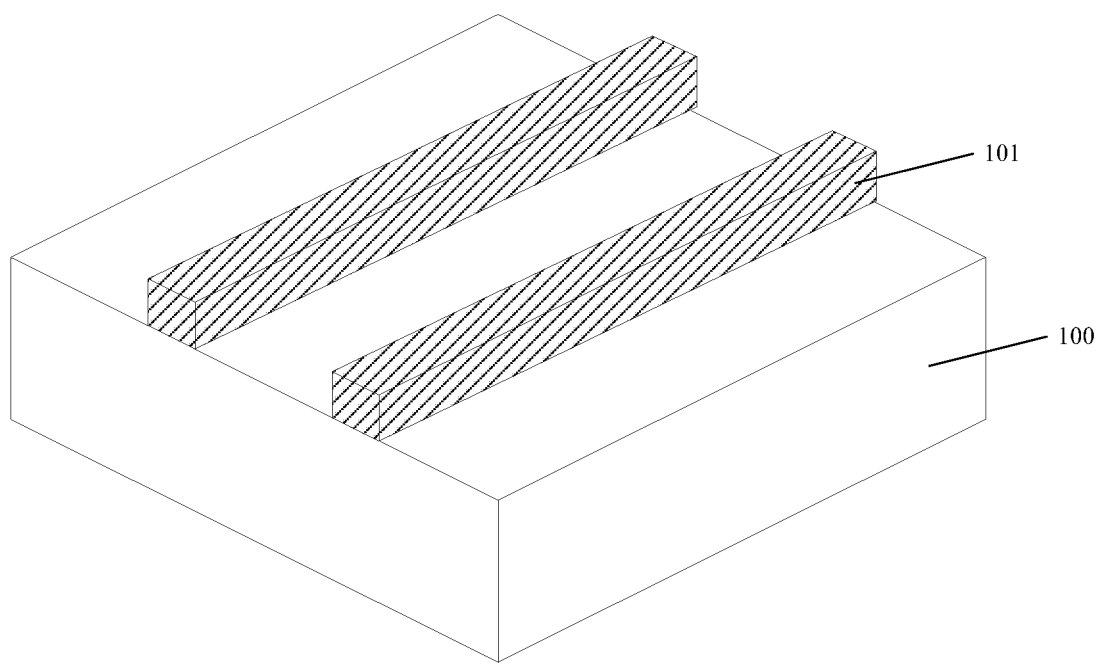
FIGS. 2~28 illustrate semiconductor structures corresponding to certain stages of an exemplary fabrication process of a FinFET structure consistent with the disclosed embodiments.

As shown in FIG. 29, at the beginning of fabrication process, a semiconductor substrate with certain structures is provided (S101). FIG. 2 illustrates a corresponding semiconductor structure.

As shown in FIG. 2, a semiconductor substrate 100 is provided. A hard mask layer 101 may be formed to cover portions of the surface of the semiconductor substrate 100. The hard mask layer 101 may include a plurality of long stripes. The plurality of long stripes may be parallel. For illustrative purposes, two long stripes will be described.

The semiconductor substrate 100 may be made of any appropriate semiconductor materials, such as single crystal silicon, polysilicon, silicon on insulator (SOI), germanium on insulator (GOI), silicon germanium, carborundum, indium antimonite, lead telluride, indium arsenide, indium phosphide, gallium arsenide, gallium antimonite, alloy semiconductor, or a combination thereof. In one embodiment, the semiconductor substrate 100 is made of single crystal silicon. The semiconductor substrate 100 provides a base for subsequent devices and processes.

The hard mask layer 101 may be made of any appropriate material, such as one of an insulating dielectric mask material including silicon nitride, or silicon oxide, etc. The hard mask layer 101 may be one of a metal oxide mask material, such as titanium oxide or tantalum nitride, etc.

The method for the forming the hard mask layer 101 may include forming a mask material layer on the surface of the semiconductor substrate 100; forming a photoresist layer on the mask material layer; exposing and developing the photoresist layer to form a patterned photoresist layer; etching the mask material layer using the patterned photoresist layer as an etching mask to form the hard mask layer 101; and removing the patterned photoresist layer.

The hard mask layer 101 may have a plurality of parallel long stripes; the width of the long stripes may be corresponding to the width of the subsequently formed fins of the FinFET structure. The hard mask layer 101 may have a certain thickness to provide sufficient protection to the top of the plurality of subsequently formed fins. In one embodiment, the thickness of the hard mask layer 101 may be in a range of approximately 10 nm~100 nm.

The mask material layer may be formed by any appropriate process, such as a chemical vapor deposition (CVD) process, a physical vapor deposition (PVD) process, an atomic layer deposition (ALD) process, or a flowable CVD (FCVD) process, etc. Various process may be used to form the mask material layer, such as a dry etching process, or a wet etching process, etc. The patterned photoresist layer may be removed by any appropriate process, such as a dry etching process, a wet etching process, or a plasma ashing process, etc.

Figure 3:
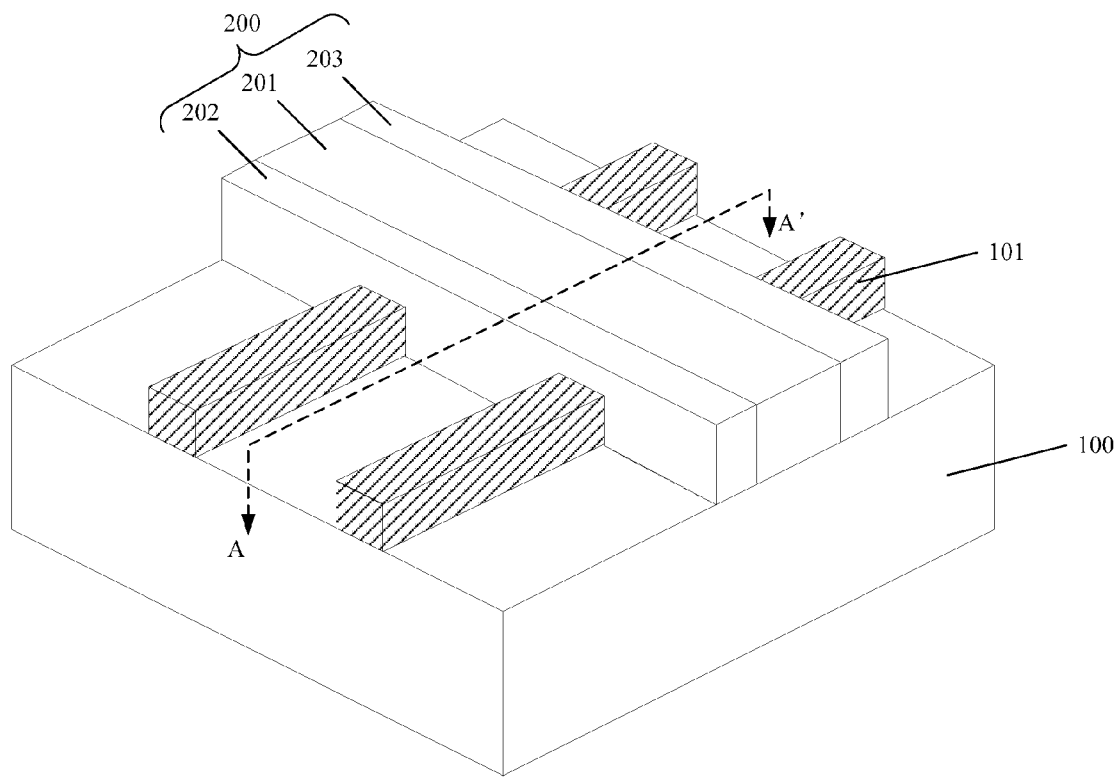
Figure 4:
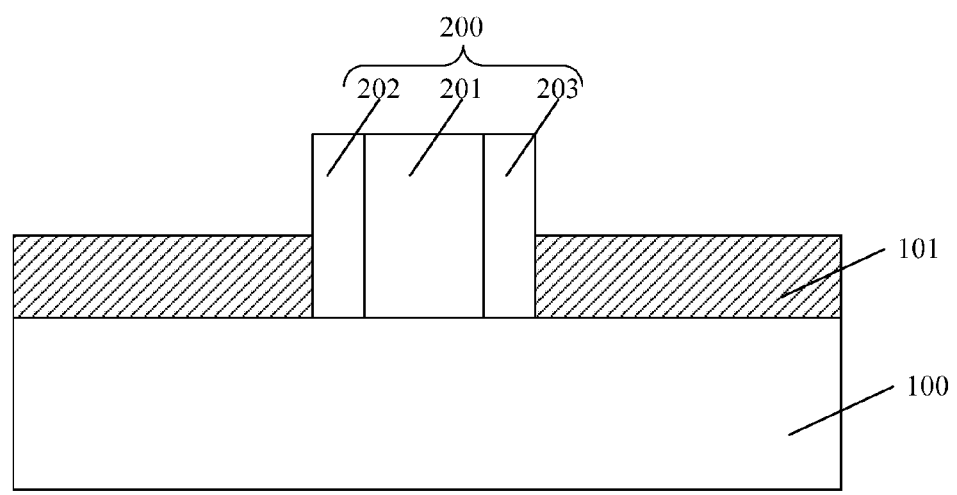

Returning to FIG. 29, after forming the hard mask layer 101, a dummy gate structure may be formed (S102). FIG. 3 illustrates a corresponding semiconductor structure; and FIG. 4 illustrates a cross-sectional view of the structure illustrated in FIG. 3 along the AA' direction. The line AA' is in between the two long stripes of the mask layer 101; and along the longitudinal direction of the long stripes.

As shown in FIGS. 3~4, a dummy gate structure 200 is formed. The dummy gate structure 200 may cross over the hard mask layer 101; and may cover portions of the side and top surfaces of the mask layer 101. The dummy gate structure 200 may include a dummy gate 201, and a first sidewall spacer 202 and a second sidewall spacer 203 on the two side surfaces of the dummy gate 201.

The dummy gate 201 may be subsequently replaced with a first metal gate structure. Thus, the dimension of the dummy gate 201 may be identical to that of the first metal gate structure. The first sidewall spacer 202 and the second sidewall spacer 203 may be subsequently replaced by a second metal gate structure and a third metal gate structure, respectively. Thus, the dimensions of the first sidewall spacer 202 and the second sidewall spacer 203 may be identical to that of the second metal gate structure and the third metal gate structure, respectively.

The width of the dummy gate 201 may be approximately 1~3 times as large as the width of the first sidewall spacer 202 or the second sidewall spacer 203. Such a size may cause the width of the subsequently formed first metal gate structure to be 1~3 times as large as the width of the subsequently formed second metal gate structure or the subsequently formed third metal gate structure.

In certain other embodiments, the width of the dummy gate 201, the width of the first sidewall spacer 202, and the width of the second sidewall spacer 203 may be adjusted according to the performance needs of the FinFET structure. By adjusting the widths of the dummy gate 201, the first sidewall spacer 202, and the second sidewall spacer 203, the work functions and control abilities of the first metal gate structure, the second metal gate structure and the third metal gate structure to the corresponding underneath channel regions may be adjusted.

The method for forming the dummy gate structure 200 may include forming a dummy gate material layer on the surface of the semiconductor substrate 100 to cover the hard mask layer 101; patterning the dummy gate material layer to form the dummy gate 201 crossing over the hard mask layer 101; forming a sidewall spacer material layer over the semiconductor substrate 100; and etching the sidewall spacer material layer to form the first sidewall spacer 202 and the second sidewall spacer 203 on the two side surfaces of the dummy gate 201.

The dummy gate 201 may be made of any appropriate material, such as photoresist, polysilicon, amorphous silicon, silicon oxycarbide, or amorphous carbon, etc. The dummy gate material layer may be formed by any appropriate process, such as a CVD process, a PVD process, or a spin-coating process, etc. In one embodiment, the dummy gate material layer is formed by a spin-coating process.

The dummy gate material layer may be different from that of the hard mask layer 101 such that the dummy gate material layer and the hard mask layer 101 may have a significant large etching selectivity. The significantly large etching selectively may avoid the damage to the hard mask layer 101 during the subsequent process for patterning the dummy gate material layer. In one embodiment, the dummy gate 201 is made of silicon oxycarbide. The dummy gate material layer may be formed by a CVD process.

Various processes may be used to pattern the dummy gate material layer to form the dummy gate 201. In one embodiment, the dummy gate 201 may be formed by patterning the dummy gate material layer by a dry etching process. The etching gas of the dry etching process may be fluorine-containing gas, such as $CF_4$, $C_2F_3$, $NF_3$, or $SF_6$, etc.

In certain other embodiments, the dummy gate material layer may be a photoresist layer. Thus, the photoresist layer may be directly exposed to form the dummy gate 201.

The first sidewall spacer 202 and the second sidewall spacer 203 may be made of any appropriate material, such as silicon nitride, or silicon oxide, etc. The material of the first sidewall spacer 202 and the second sidewall spacer 203 may be different from that of the hard mask layer 101. Thus, the hard mask layer 101 may have a relatively large etching selectivity with the first sidewall spacer 202 and the second sidewall spacer 203. The relatively large etching selectivity may prevent the hard mask layer 101 from being damaged during the subsequent process for patterning the sidewall spacer material layer. The sidewall spacer material layer may be formed by any appropriate process, such as a CVD process, or an FCVD process, etc.

In certain other embodiments, after forming the dummy gate structure 200, a source/drain ion implantation process may be performed on the semiconductor substrate 100 at two sides of the dummy gate structure 200. Thus, a source region and a drain region (not shown) may be formed in the semiconductor substrate 100 at the two sides of the dummy gate structure 200, respectively. The doping ions may be N-type ions or P-type ions; and may be identical to types of the FinFET.

Figure 5:
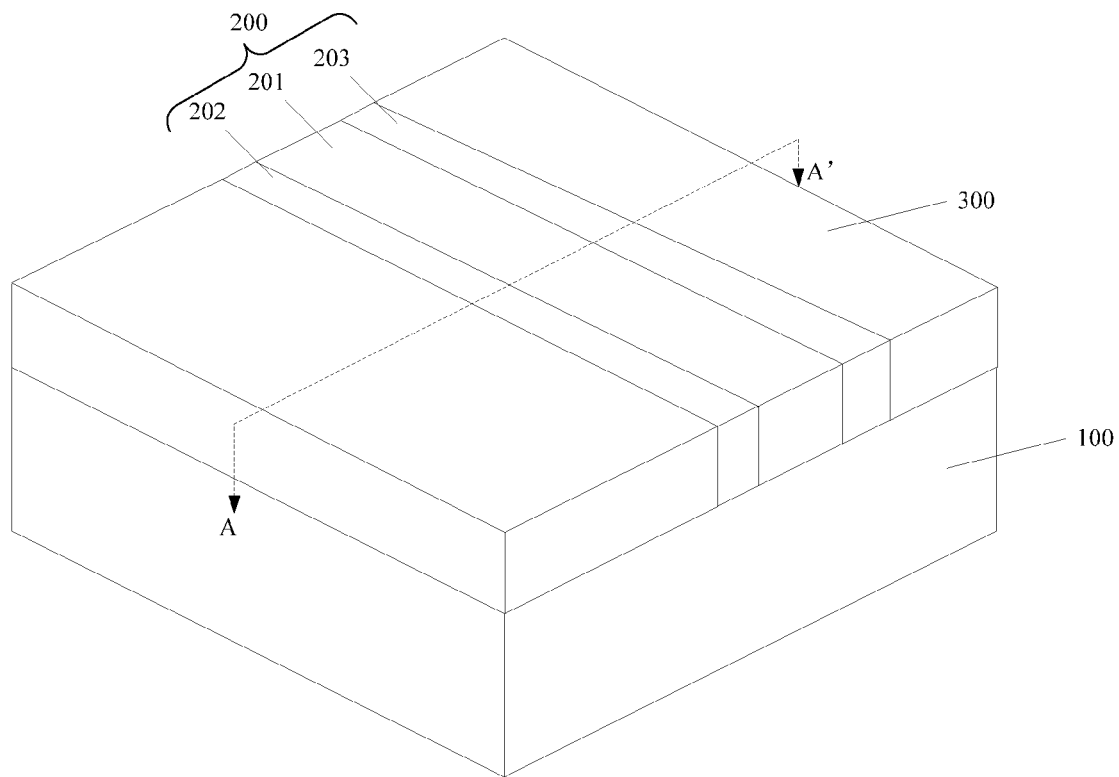

Returning to FIG. 29, after forming the gate structure 200, a dielectric layer may be formed (S103). FIG. 5 illustrates a corresponding semiconductor structure; and FIG. 6 illustrates a cross-sectional view of the structure illustrated in FIG. 5 along the AA' direction.

Figure 6:
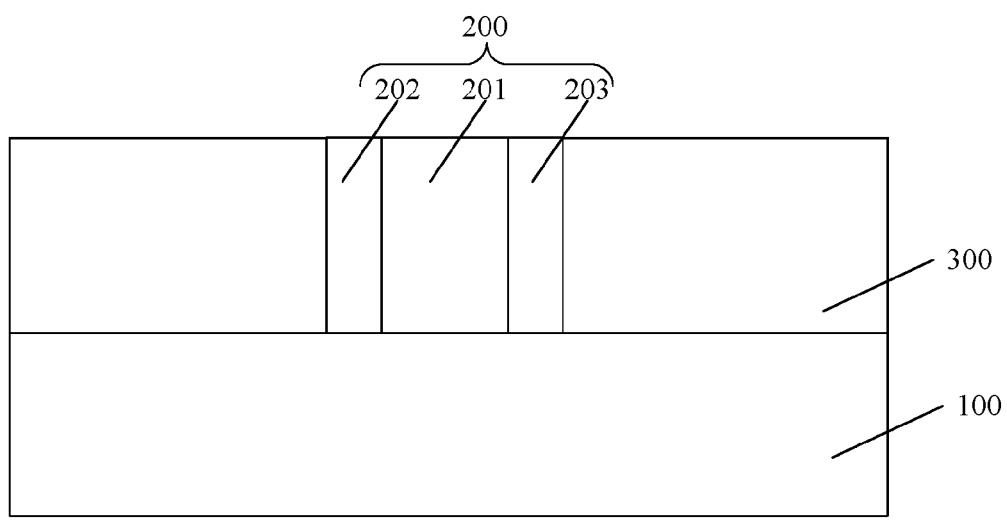

As illustrated in FIGS. 5~6, a dielectric layer 300 is formed on the surface of the semiconductor substrate 100. The surface of the dielectric layer 300 may level with the top surface of the dummy gate structure 200. The dielectric layer 300 may cover the hard mask layer 101 (referring to FIG. 3) and the side surfaces of the dummy gate structure 200. Further, the top surfaces of the dummy gate 201, the first sidewall spacer 202 and the second sidewall spacer 203 may be exposed. Such a structure may facilitate to subsequently remove the dummy gate 201, the first sidewall spacer 202 and the second sidewall spacer 203.

The method for forming the dielectric layer 300 may include forming a dielectric material layer covering the hard mask layer 101 and the dummy gate structure 200 over the semiconductor substrate 100; and followed by planarizing the dielectric material layer using the dummy gate structure 200 as a stop layer. Thus, the dielectric layer 300 may be formed; and the top surface of the dielectric layer 300 may level with the top surface of the dummy gate structure 200.

The dielectric material layer may be made of any appropriate material, such as silicon oxide, silicon oxycarbide, or silicon oxynitride, etc. Various processes may be used to form the dielectric material layer, such as a spin-coating process, a CVD process, or an FCVD process, etc. In one embodiment, the dielectric material layer is made of silicon oxide; and formed by a CVD process.

The surface of the dielectric material layer may be higher than that of the dummy gate structure 200. Various processes may be used to planarize the dielectric material layer to form the dielectric layer 300. In one embodiment, the dielectric material layer is planarized by a chemical mechanical polishing (CMP) process.

Figure 7:
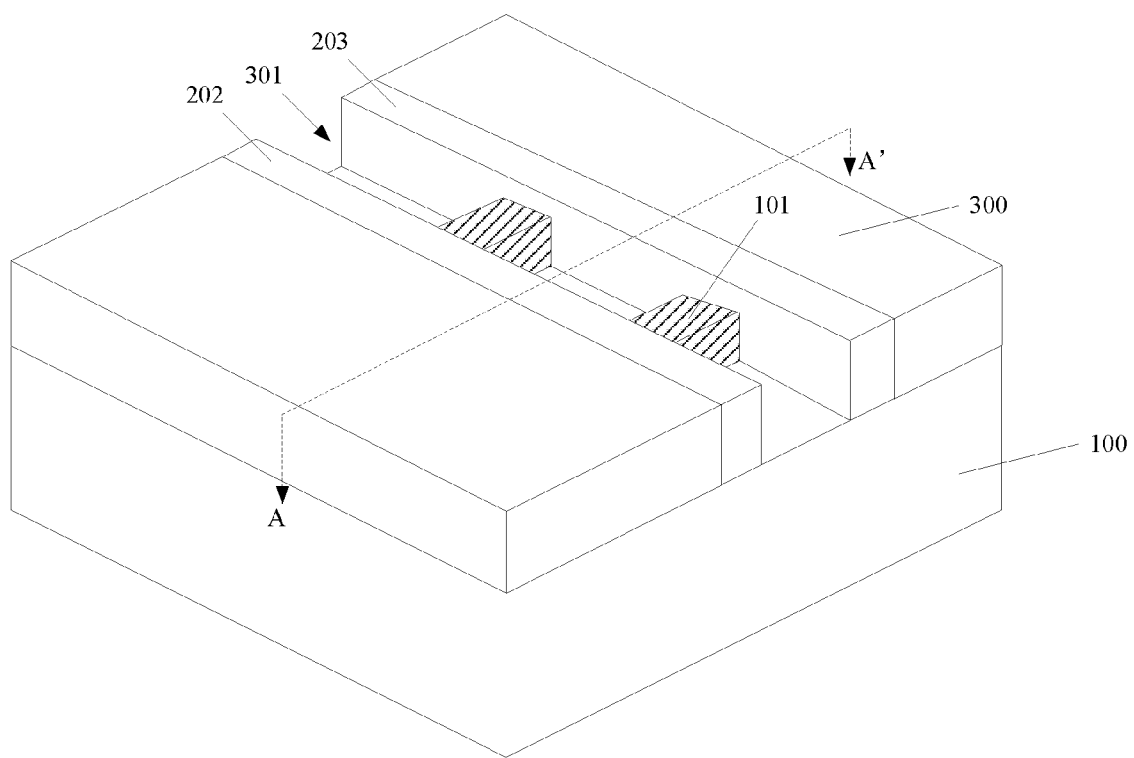
Figure 8:
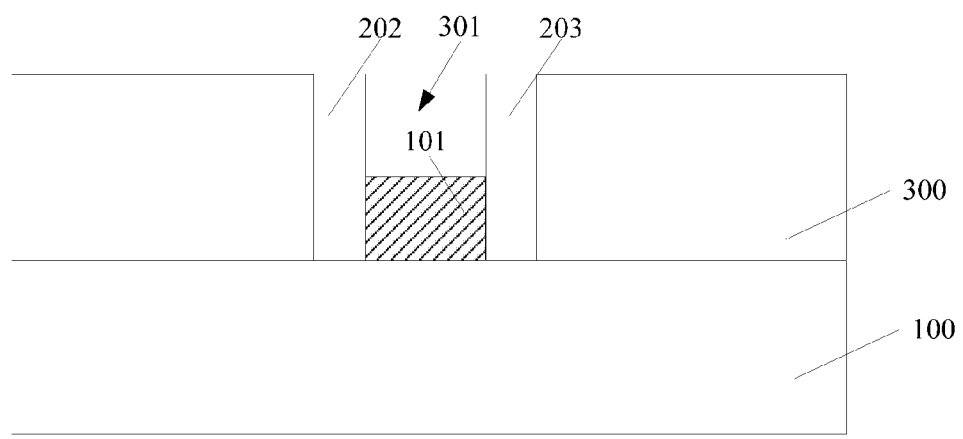

Returning to FIG. 29, after forming the dielectric layer 300, the dummy gate 301 may be removed; and a first trench may be formed (S104). FIG. 7 illustrates a corresponding semiconductor structure. FIG. 8 illustrates a cross-sectional view of the structure illustrated in FIG. 7 along the AA' direction; and FIG. 9 illustrates a top view of the structure illustrated in FIG. 7.

Figure 9:
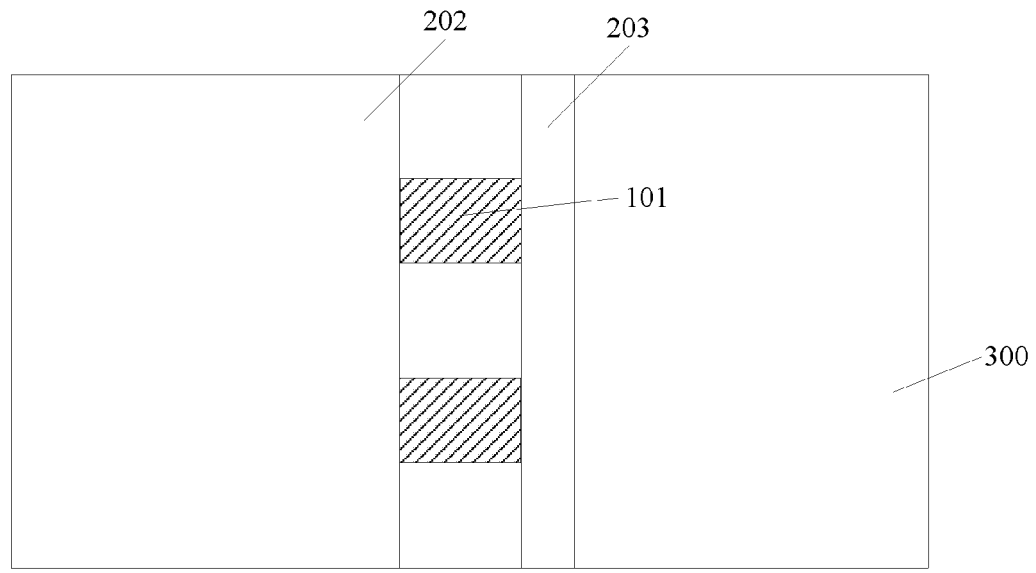

As illustrated in FIGS. 7~9, the dummy gate 201 is removed; and a first trench 301 is formed. 301. Portions of the surface of the semiconductor substrate 100 and portions of the surface of the hard mask layer 101 may be exposed.

The dummy gate 201 may be removed by any appropriate process, such as a dry etching process, a wet etching process, or an ashing process, etc. In one embodiment, to avoid the damage to the semiconductor substrate 100 and the hard mask layer 101 caused by the plasma in a dry etching process, a wet etching process or an ashing process may be used to remove the dummy gate 201. An etching solution with a relatively high etching selectivity to the dummy gate 201 may be selected in the wet etching process so as to avoid the damage to the dielectric layer 300, the first sidewall spacer 202, the second sidewall spacer 203, the semiconductor substrate 100 and the hard mask layer 101.

Referring to FIGS. 7~9, after removing the dummy gate 201, the first trench 301 may be formed between the first sidewall spacer 202 and the second sidewall spacer 203. Portions of the surfaces of the hard mask layer 101 and the semiconductor substrate 100 that are not covered by the hard mask layer 101 may be exposed by the first trench 301.

Figure 10:
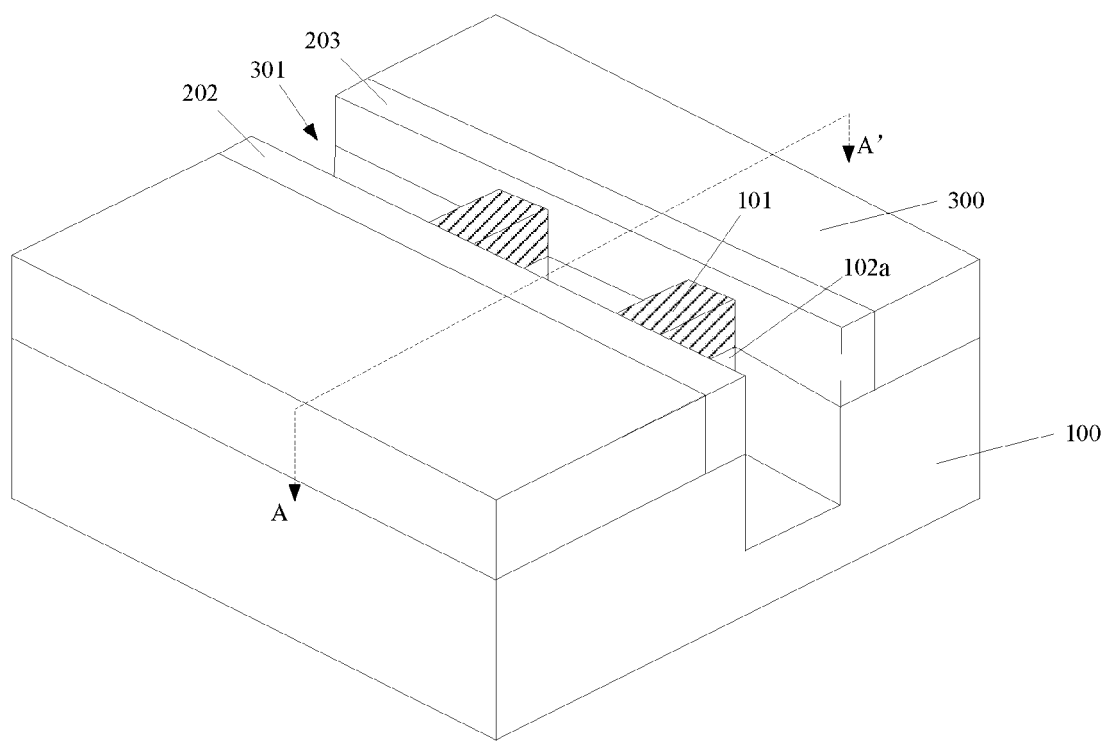
Figure 11:
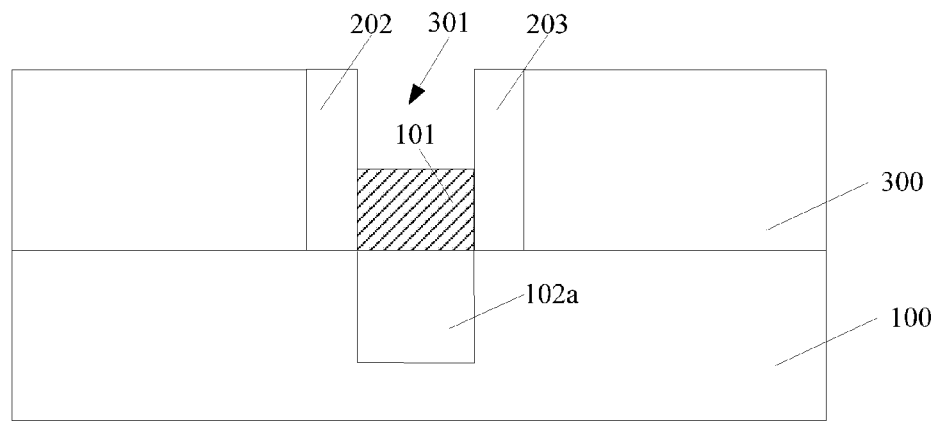

Returning to FIG. 29, after forming the first trench 301, first sub-fins may be formed (S105). FIG. 10 illustrates a corresponding semiconductor structure. FIG. 11 illustrates a cross-sectional view of the structure illustrated in FIG. 10 along the AA' direction.

As illustrated in FIGS. 10~11, a first sub-fin 102a is formed in the semiconductor substrate 100 under each of the long stripes of the mask layer 101. The first sub-fins 102a may be formed by etching the semiconductor substrate 100 using the hard mask layer 101 as an etching mask. That is, the first sub-fins 102a under the hard mask layer 101 may be formed by etching portions of the semiconductor substrate 100 exposed by the first trench 301 and not covered by the hard mask layer 101.

The exposed semiconductor substrate 100 may be etched by any appropriate process, such as a dry etching process, or a wet etching process, etc. In one embodiment, a dry etching process is used to etch the exposed semiconductor substrate 100. Specifically, a plasma etching process may be used as the dry etching process. A mixture of HBr and $Cl_2$ may be used as the etching gas; and $O_2$ may be used as the buffering gas. The flow rate of HBr may be in a range of approximately 50 sccm~1000 sccm. The flow rate of $Cl_2$ may be in a range of approximately 50 sccm~1000 sccm. The flow rate of $O_2$ may be in a range of approximately 5 sccm~20 sccm. The pressure of the etching chamber may be in a range of approximately 5 mTorr~50 mTorr. The power of the plasma may be in a range of approximately 400 W~750 W. The etching temperature may be in a range of approximately 40° C.~80° C. The bias voltage of the plasma may be in a range of approximately 100 V~250 V. Such a plasma etching process may have a relatively high etching selectivity to the semiconductor substrate 100. Therefore, the semiconductor substrate 100 may be etched anisotropically.

During the process for etching the semiconductor substrate 100 on the bottom of the first trench 301, other portions of the semiconductor substrate 100 may be protected by the first sidewall spacer 201, the second sidewall spacer 203 and the dielectric layer 300. Therefore, the first sub-fins 102a may only be formed on the bottom of the first trench 301 (under the mask layer 101); and the depth of the first trench 301 may be increased.

The width of the first sub-fins 102a may be determined by the width of the hard mask layer 101. In one embodiment, the side surfaces of the first sub-fins 102a may be perpendicular to the surface of the semiconductor substrate 100. In certain other embodiments, the first sub-fins 102a may have a tilted side surface. That is, the bottom width of the first sub-fins 102a may be smaller than the top width of the first sub-fins 102a.

Figure 12:
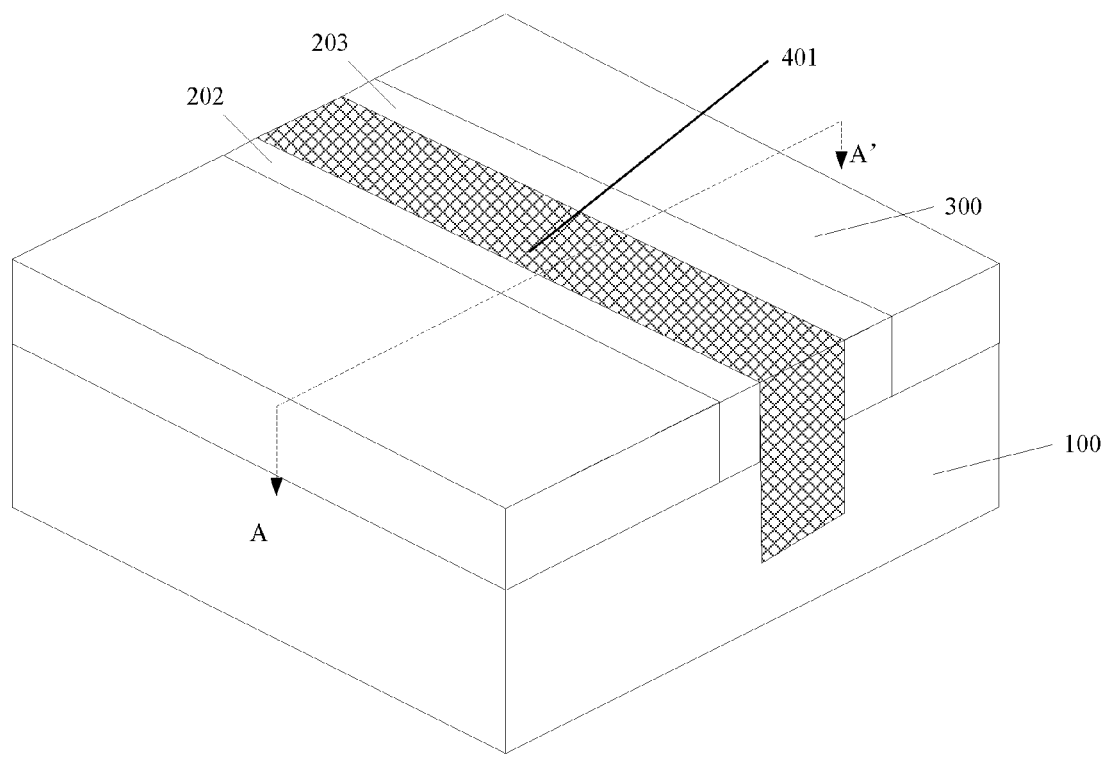
Figure 13:
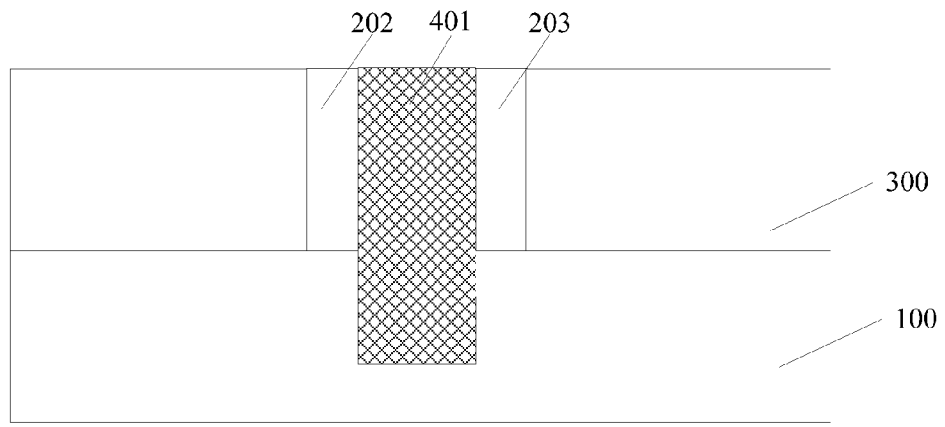

Returning to FIG. 29, after forming the first sub-fins 102a, a first metal gate structure may be formed (S106). FIG. 12 illustrates a corresponding semiconductor structure. FIG. 13 illustrates a cross-sectional view of the structure illustrated in FIG. 12 along the AA' direction.

As illustrated in FIGS. 12~13, a first metal gate structure 401 is formed in the first trench 301 (as shown in FIG. 10). The first metal gate structure 401 may fill the first trench 301. The first metal gate structure 401 may cross over the hard mask layer 101 and the first sub-fins 102a in the first trench 301; and cover the side surfaces of the first sub-fins 102a and the side and the top surfaces of the hard mask layer 101.

The first metal gate structure 401 may include a first gate dielectric layer (not labeled) and a first metal gate (not labeled) formed on the surface of the first gate dielectric layer. The first gate dielectric layer may be made of a high-K dielectric material, such as hafnium oxide, zirconia oxide, lanthanum oxide, aluminum oxide, or hafnium silicon oxide, etc. The first metal gate may usually be made of metal material, such as gold, silver, aluminum, tungsten, or titanium, etc. In one embodiment, the first gate dielectric layer is made of hafnium oxide; and the first metal gate is made of silver.

The method for forming the first metal gate structure 401 may include forming a first gate dielectric material layer on the inner surfaces of the first trench 301, and on the surfaces of the first sidewall spacer 202, the second sidewall spacer 203 and the dielectric layer 300; forming a first metal gate material layer on the first gate dielectric material layer and filling the first trench 301; and planarizing the first metal gate material layer and the first gate dielectric material layer using the dielectric layer 300 as a stop layer. Thus, the first metal gate structure 401 may be formed in the first trench 301. The top surface of the first metal gate structure 401 may level with the top surface of the dielectric layer 300.

The first gate dielectric layer may be formed by any appropriate process, such as a CVD process, a PVD process, or an FCVD process, etc. The first metal gate material layer may be formed by any appropriate process, such as a PVD process, a sputtering process, or an electroplating process, etc. The first metal gate material layer and the first gate dielectric material layer may be planarized by any appropriate process, such as a CMP process, or a dry etching process, etc.

In one embodiment, the first metal gate structure 401 may cross over two first sub-fins 102a simultaneously; and cover the side surfaces of the first sub-fins 102a. The side surfaces of the first sub-fins 102a may be used as portions of the channel regions of FinFET; and may be controlled by the first metal gate structure 401. The turn-on threshold voltage and the switching frequency of the channel regions located on the side surfaces of the first sub-fins 102a may be affected by the work function of the first metal gate structure 401 and other parameters.

Figure 14:
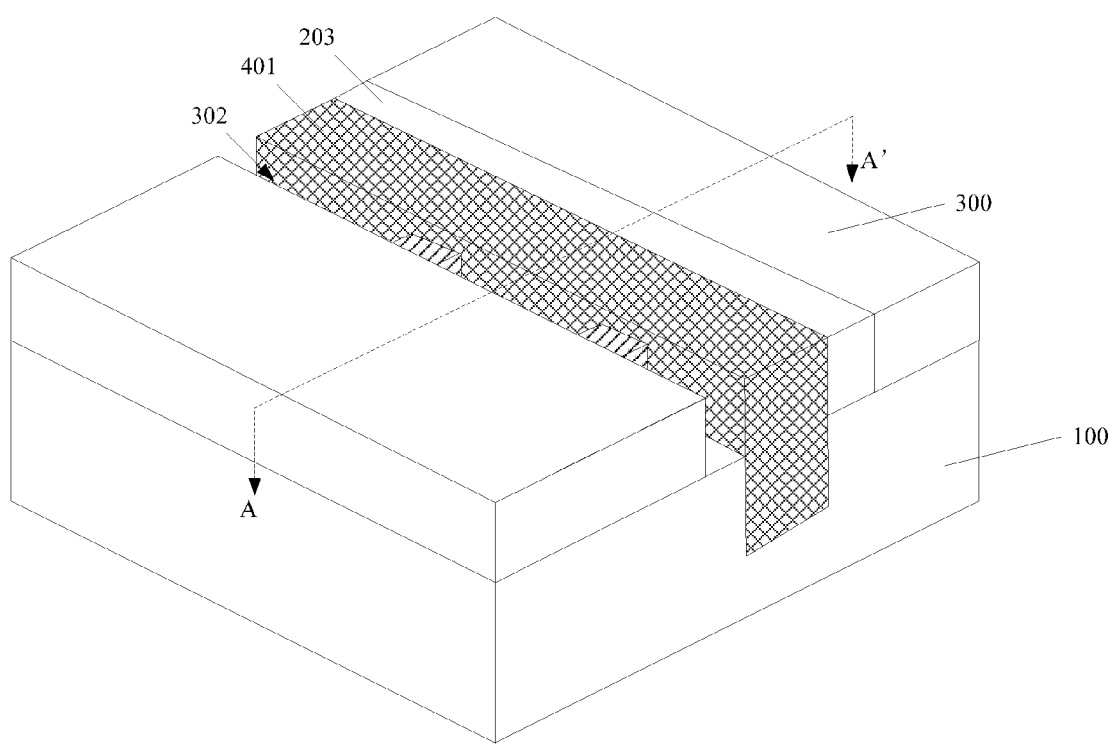
Figure 15:
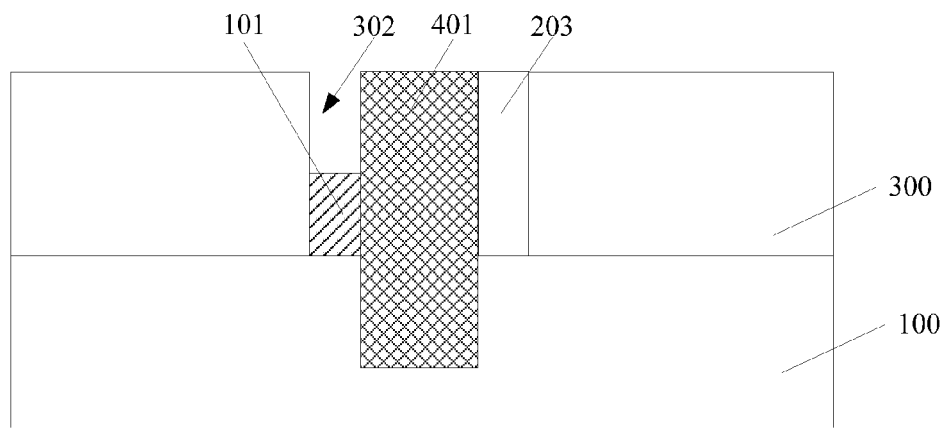

Returning to FIG. 29, after forming the first gate structure 401, the first sidewall spacer 202 may be removed; and a second trench may be formed (S107). FIG. 14 illustrates a corresponding semiconductor structure. FIG. 15 illustrates a cross-sectional view of the structure illustrated in FIG. 14 along the AA' direction.

As illustrated in FIGS. 14~15, the first sidewall spacer 202 is removed; and a second trench 302 may be formed. Portions of the surfaces of the semiconductor substrate 100 and the hard mask layer 101 may be exposed.

The first sidewall spacer 202 may be removed by any appropriate process, such as a dry etching process, or a wet etching process, etc. In one embodiment, the first sidewall spacer 202 is removed by a wet etching process. The wet etching process may avoid the damage to the semiconductor substrate 100 and the hard mask layer 101 caused by the plasma of a dry etching process.

Before removing the first sidewall spacer 202, a protection layer may be formed to cover the second sidewall spacer 203. The protection layer may protect the second sidewall spacer 203 during the process for removing the first sidewall spacer 202. After the first sidewall spacer 202 is removed, the protection layer may be removed. The protection layer may be made of photoresist, or other material different from that of the first sidewall spacer 202.

The etching solution of the wet etching process may have a relatively high etching selectivity to the first sidewall spacer 202 so as to avoid the damage to the dielectric layer 300, the semiconductor substrate 100 and the hard mask layer 101 during the etching process for removing the first sidewall spacer 202. In one embodiment, the first sidewall spacer 202 is made of silicon nitride; and a phosphate solution may be used as the etching solution of the wet etching process.

In certain other embodiments, after forming the protection layer covering the second sidewall spacer 202, hydrogen or helium ions may be doped into the first sidewall spacer 202. Then, the first sidewall spacer 202 may be removed by a wet etching process using a hydrogen fluoride solution as an etching solution.

Specifically, hydrogen or helium ions may be doped into the first sidewall spacer 202 by a capacitive-coupled plasma doping process. The bias power may be in a range of approximately 0~500 W. The pressure may be in a range of approximately 25 mTorr~80 mTorr. Further, the concentration of hydrogen fluoride used in the wet etching process may be in range of approximately 0.5~2%.

By doping hydrogen or helium ions into the first sidewall spacer 202, the number of N—H bonds in the first sidewall spacer 202 may be increased. Further, the Si—N bonds in the first sidewall spacer 202 may be broken to accelerate the etching of the first sidewall spacer 202 in the hydrogen fluoride solution. Therefore, after the doping process, a hydrogen fluoride solution may be used for the wet etching process of the first sidewall spacer 202 to avoid removing the first sidewall spacer 202 using a phosphate solution. The use of the phosphate solution in the wet etching process may usually cause a particle contamination problem, and require a high temperature in the range of approximately 140° C.~180° C., which may easily lead to operational safety issues. Therefore, the hydrogen fluoride solution may be used to avoid the problems caused by the phosphate solution.

After the first sidewall spacer 202 is removed, the second trench 302 may be formed between the dielectric layer 300 and the first metal gate structure 401. Portions of the surfaces of the hard mask layer 101 and the semiconductor substrate 100 not covered by the hard mask layer 101 may be exposed by the second trench 302.

Figure 16:
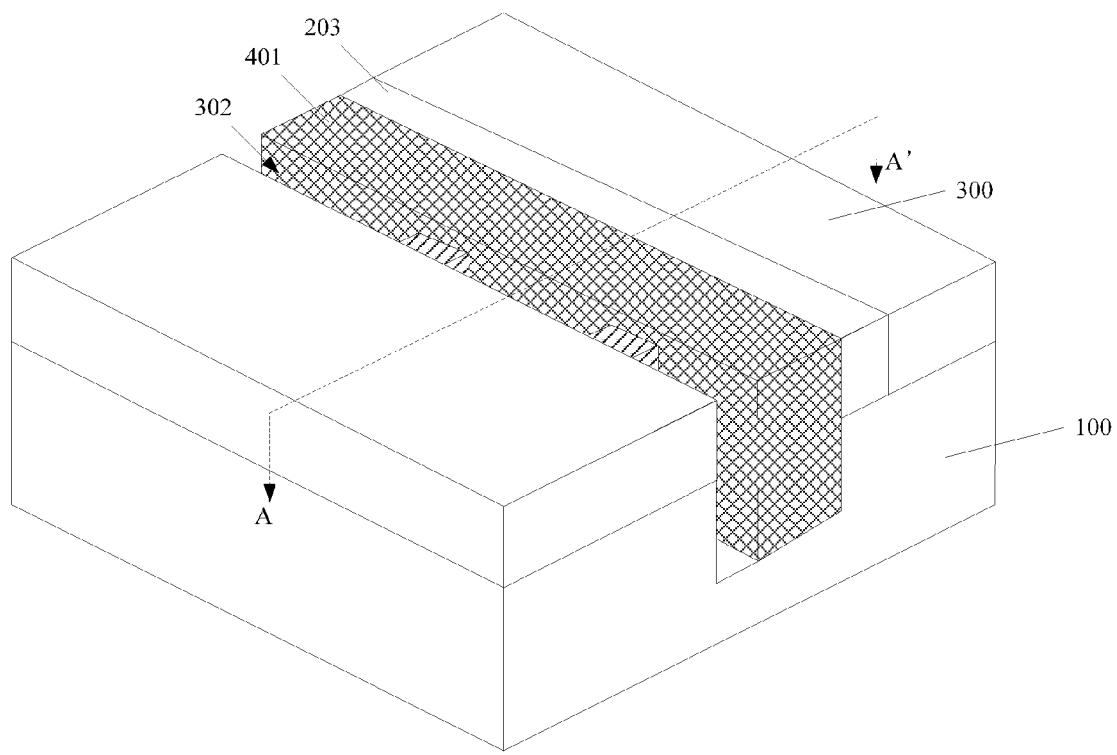
Figure 17:
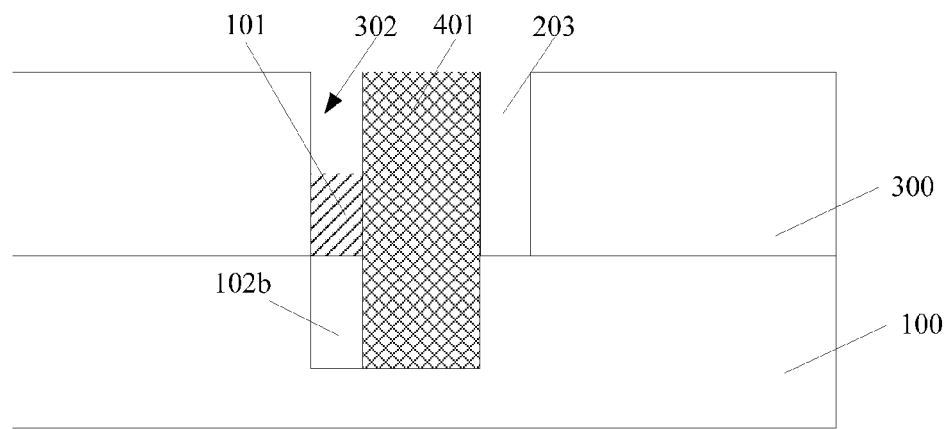

Returning to FIG. 29, after forming the second trench 302, second sub-fins may be formed (S108). FIG. 16 illustrates a corresponding semiconductor structure. FIG. 17 illustrates a cross-sectional view of the structure illustrated in FIG. 16 along the AA' direction.

As illustrated in FIGS. 16~17, second sub-fins 102b are formed. The second sub-fins 102b may be formed by etching the semiconductor substrate 100 using the hard mask layer 101 as an etching mask. The width of the second sub-fins 102b may be determined by the width the long stripes of the hard mask layer 101. In one embodiment, the side surfaces of the second sub-fins 102b may be perpendicular to the surface of the semiconductor substrate 100. In certain other embodiments, the second sub-fins 102b may have tilted side surfaces. That is, the bottom width of the second sub-fins 102b may be smaller than the top width of second sub-fins 102b.

The semiconductor substrate 100 may be etched by any appropriate process, such as a dry etching process, or a wet etching process, etc. In one embodiment, a dry etching process is used to etch the portions of the semiconductor substrate 100 on the bottom of the second trench 302 not covered by the hard mask layer 101 to form the second sub-fins 102b. Specifically, the dry etching process may be a plasma etching process. A mixture of HBr and $Cl_2$ may be used as the etching gas of the plasma etching process; and $O_2$ may be used as a buffer gas. The flow rate of HBr may be in a range of approximately 50 sccm~1000 sccm. The flow rate of $Cl_2$ may be in a range of approximately 50 sccm~1000 sccm. The flow rate of $O_2$ may be in a range of approximately 5 sccm~20 sccm. The pressure of the plasma etching process may be in a range of approximately 5 mTorr~50 mTorr. The power of the plasma may be in a range of approximately 400 W~750 W. The temperature of the plasma etching process may be in a range of approximately 40° C.~80° C. The bias voltage of the plasma may be in a range of approximately 100 V~250 V. Such a plasma etching process may have a relatively high etching selectivity to the semiconductor substrate 100. Thus, the semiconductor substrate 100 may be etched anisotropically.

During the etching of the semiconductor substrate 100 on the bottom of the second trench 302, other portions of the semiconductor substrate 100 may be protected by the first metal gate structure 401, the second sidewall spacer 203 and the dielectric layer 300. Thus, the second sub-fins 102b may only be formed on under the long stripes of the hard mask layer 101, and the depth of the second trench 302 may be increased.

Figure 18:
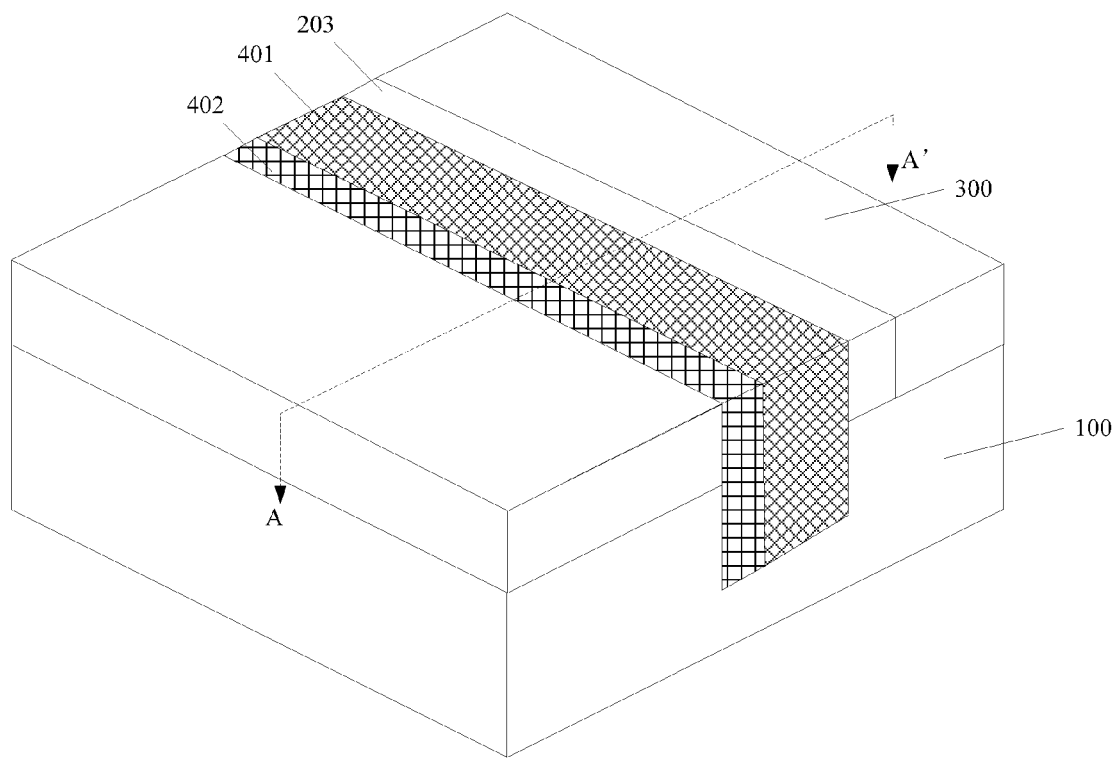
Figure 19:
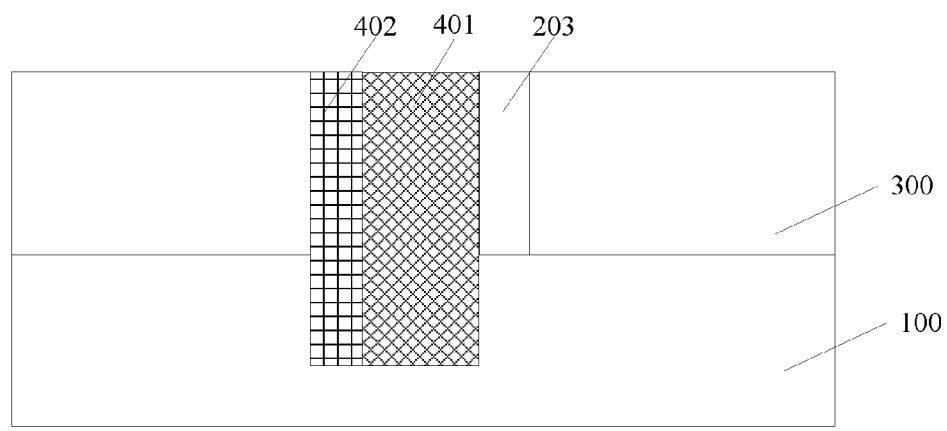

Returning to FIG. 29, after forming the second sub-fins 102b, a second metal gate structure may be formed (S109). FIG. 18 illustrates a corresponding semiconductor structure. FIG. 19 illustrates a cross-sectional view of the structure illustrated in FIG. 18 along the AA' direction.

As illustrated in FIGS. 18~19, a second metal gate structure 402 is formed in the second trench 302 (as shown in FIG. 16). The second metal gate structure 402 may fill the second trench 302. Further, the second metal gate structure 402 may cross over the hard mask layer 101 and the second sub-fins 102b in the second trench 302, and cover the side surfaces of the second sub-fins 102b and the side and the top surfaces of the hard mask layer 101.

In one embodiment, the second metal gate structure 402 may cross over two second sub-fins 102b simultaneously, and cover the side surfaces of the second sub-fins 102b. The side surfaces of the second sub-fins 102b may be used as portions of the channel regions of the FinFET, and may be controlled by the second metal gate structure 402. The turn-on threshold voltage and the switching frequency of the channel regions located on the side surfaces of the second sub-fins 102b may be affected by the work function of the second metal gate structure 402 and other parameters.

The second metal gate structure 402 may include a second gate dielectric layer (not labeled) and a second metal gate (not labeled) formed on the surface of the second gate dielectric layer. The second gate dielectric layer may be made of a high-K dielectric material, such as hafnium oxide, zirconia oxide, lanthanum oxide, aluminum oxide, or hafnium silicon oxide, etc. The second metal gate may be made of metal material, such as gold, silver, aluminum, tungsten, or titanium, etc. In one embodiment, the second gate dielectric layer is made of hafnium oxide; and the second metal gate is made of gold.

In one embodiment, the second metal gate material layer of the second metal gate structure 402 may be made of a material different from the first metal gate material of the first metal gate structure 401. Therefore, the second metal gate structure 402 and the first metal gate structure 401 may have different work functions, and different control abilities to the corresponding channel regions. The second metal gate material of the second metal gate structure 402 and the first metal gate material of the first metal gate structure 401 may be adjusted according to the performance requirements of the FinFET device.

The method for forming the second metal gate structure 402 may include forming a second gate dielectric material layer on the inner surfaces the second trench 302, and on the first metal gate structure 401, the second sidewall spacer 203 and the dielectric layer 300; forming a second metal gate material layer on the second gate dielectric material layer to fill the second trench 302; and planarizing the second gate dielectric layer and the second metal gate material layer using the top surface of the of the dielectric layer 300 as a stop layer. Thus, the second metal gate structure 402 may be formed in the second trench 302. The top surface of the second metal gate structure 402 may level with the top surface of the dielectric layer 300.

The second gate dielectric material layer may be formed by any appropriate process, such as a CVD process, an ALD process, or an FCVD process, etc. The second metal gate material layer may be formed by any appropriate process, such as a CVD process, a PVD process, a sputtering process, or an electroplating process, etc. The second gate dielectric layer and the second metal gate material layer may be planarized by any appropriate process, such as a CMP process, etc.

Figure 20:
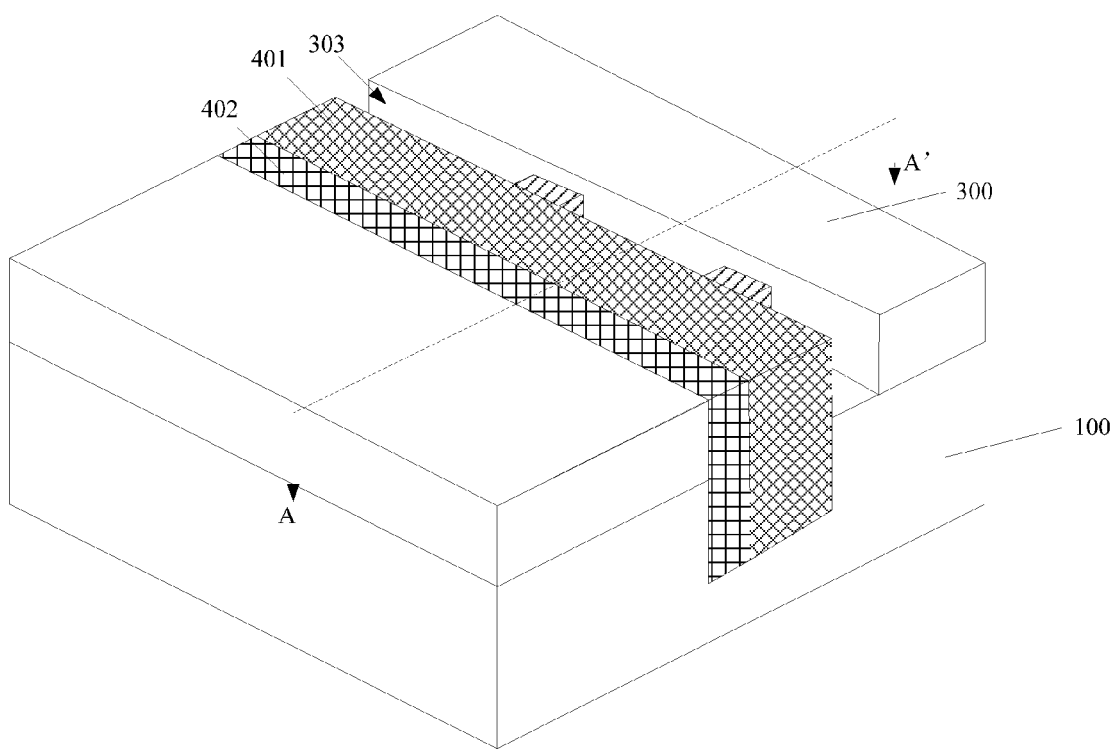
Figure 21:
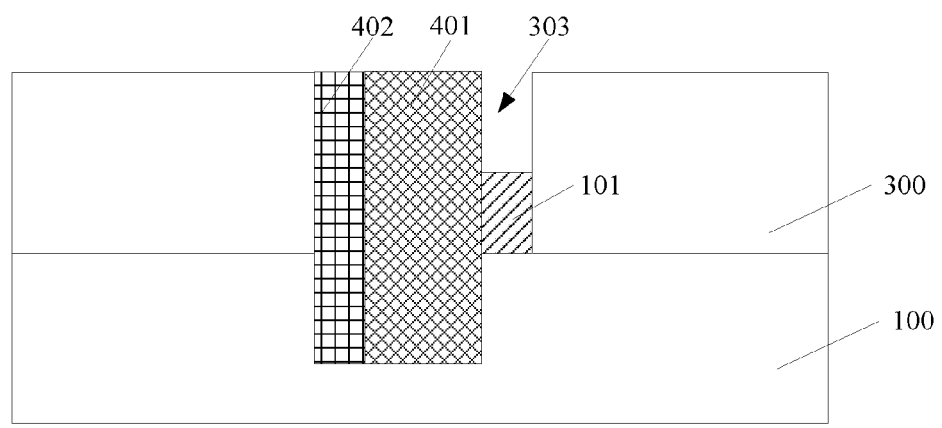

Returning to FIG. 29, after forming the second metal gate structure 402, a third trench may be formed (S110). FIG. 20 illustrates a corresponding semiconductor structure. FIG. 21 illustrates a cross-sectional view of the structure illustrated in FIG. 20 along the AA' direction.

As illustrated in FIGS. 20~21, a third trench 303 is formed. The third trench 303 may be formed by removing the second sidewall spacer 203 (shown in FIG. 18). Portions of the surfaces of the semiconductor substrate 100 and the hard mask layer 101 may be exposed.

The second sidewall spacer 203 may be removed by any appropriate process, such as a wet etching process, or a dry etching process, etc. In one embodiment, the second sidewall spacer 203 is removed by a wet etching process. The wet etching process may avoid the damage to the semiconductor substrate 100 and the hard mask layer 101 caused by the plasma of a dry etching process.

After the second sidewall spacer 203 is removed, the third trench 303 may be formed between the dielectric layer 300 and the first metal gate structure 401. Portions of the surfaces of the hard mask layer 101 and the semiconductor substrate 100 not covered by the hard mask layer 101 may be exposed by the third trench 303.

Figure 22:
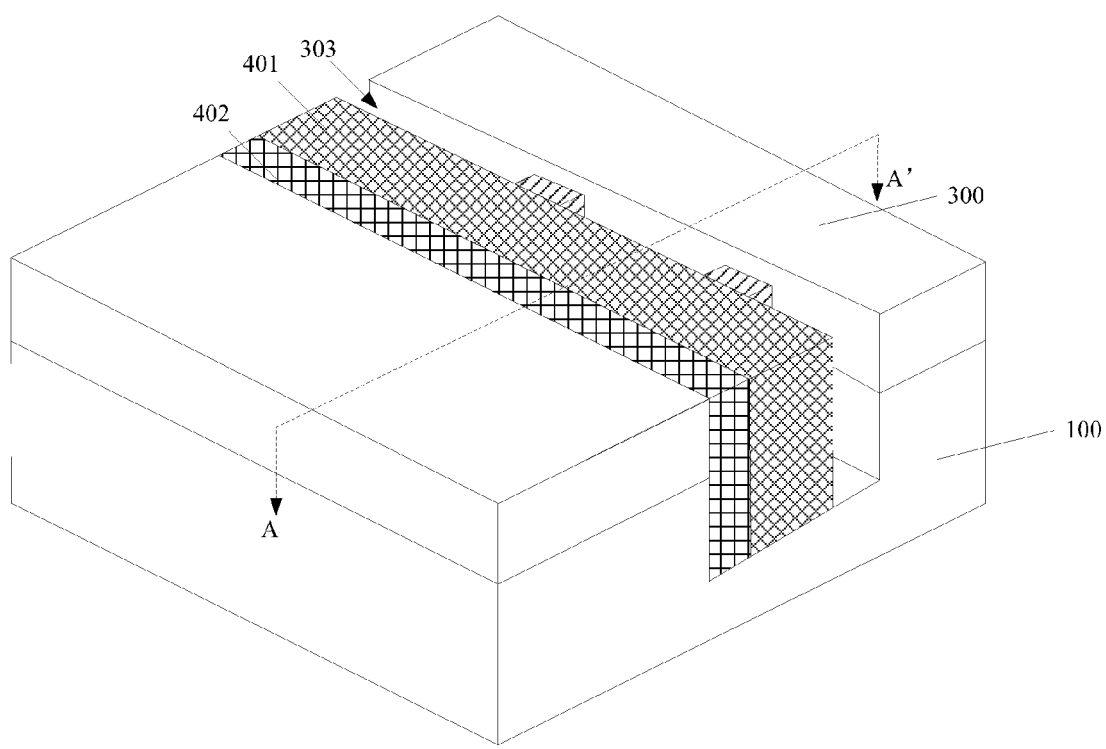
Figure 23:
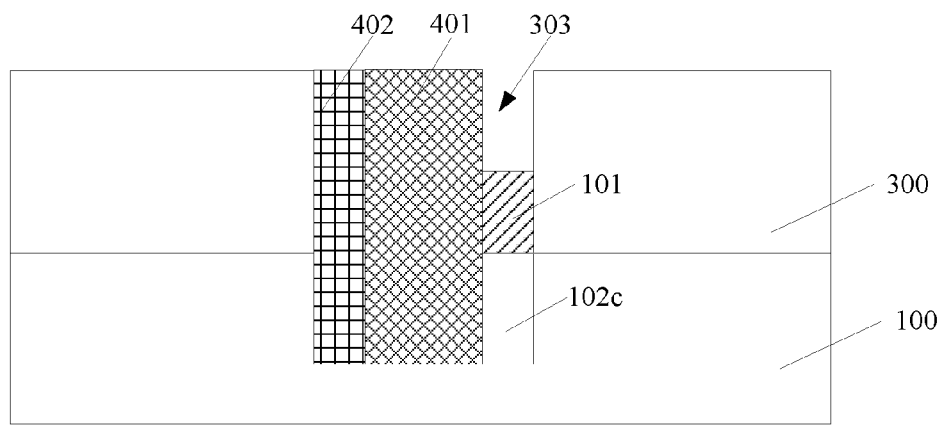

Returning to FIG. 29, after forming the third trench 303, third sub-fins may be formed (S111). FIG. 22 illustrates a corresponding semiconductor structure. FIG. 23 illustrates a cross-sectional view of the structure illustrated in FIG. 22 along the AA' direction.

As illustrated in FIGS. 22~23, third sub-fins 102*c* are formed under the long stripes of the first mask layer 101. The third sub-fins 102*c* may be formed by etching the semiconductor substrate 100 using the hard mask layer 101 as an etching mask.

The width of the third sub-fins 102*c* may be determined by the width of the long stripes of the hard mask layer 101. In one embodiment, the side surfaces of the third sub-fins 102*c* may be perpendicular to the surface of the semiconductor substrate 100. In certain other embodiments, the third sub-fins 102*c* may have tilted side surfaces. That is, the bottom width of the third sub-fins 102*c* may be smaller than the top width of the third sub-fins 102*c*.

Various processes may be used to etch the semiconductor substrate 100 to form the third sub-fins 102*c*, such as a dry etching process, or a wet etching process, etc. In one embodiment, a dry etching process is used to etch the portions of the semiconductor substrate 100 on the bottom of the third trench 303 not covered by the hard mask layer 101.

Specifically, the dry etching process may be a plasma etching process. A mixture of HBr and $Cl_2$ may be used as an etching gas; and $O_2$ may be used as a buffer gas. The flow rate of HBr may be in a range of approximately 50 sccm~1000 sccm. The flow rate of $Cl_2$ may be in a range of approximately 50 sccm~1000 sccm. The flow rate of $O_2$ may be in a range of approximately 5 sccm~20 sccm. The pressure of the plasma etching process may be in a range of approximately 5 mTorr~50 mTorr. The power of the plasma may be in a range of approximately 400 W~750 W. The temperature of the plasma etching process may be in a range of approximately 40° C.~80° C. The bias voltage of the plasma may be in a range of approximately 100 V~250 V. Such a plasma etching process may have a relatively high etching selectivity to the semiconductor substrate 100. Thus, the semiconductor substrate 100 may be etched anisotropically.

During the etching of the semiconductor substrate 100 on the bottom of the third trench 303, other portions of the semiconductor substrate 100 may be protected by the first metal gate structure 401, the second metal gate structure 402 and the dielectric layer 300. Thus, the third sub-fins 102*c* may only be formed on the bottom of the third trench 303 under the first mask layer 101; and the depth of the third trench 303 may be increased.

Figure 24:
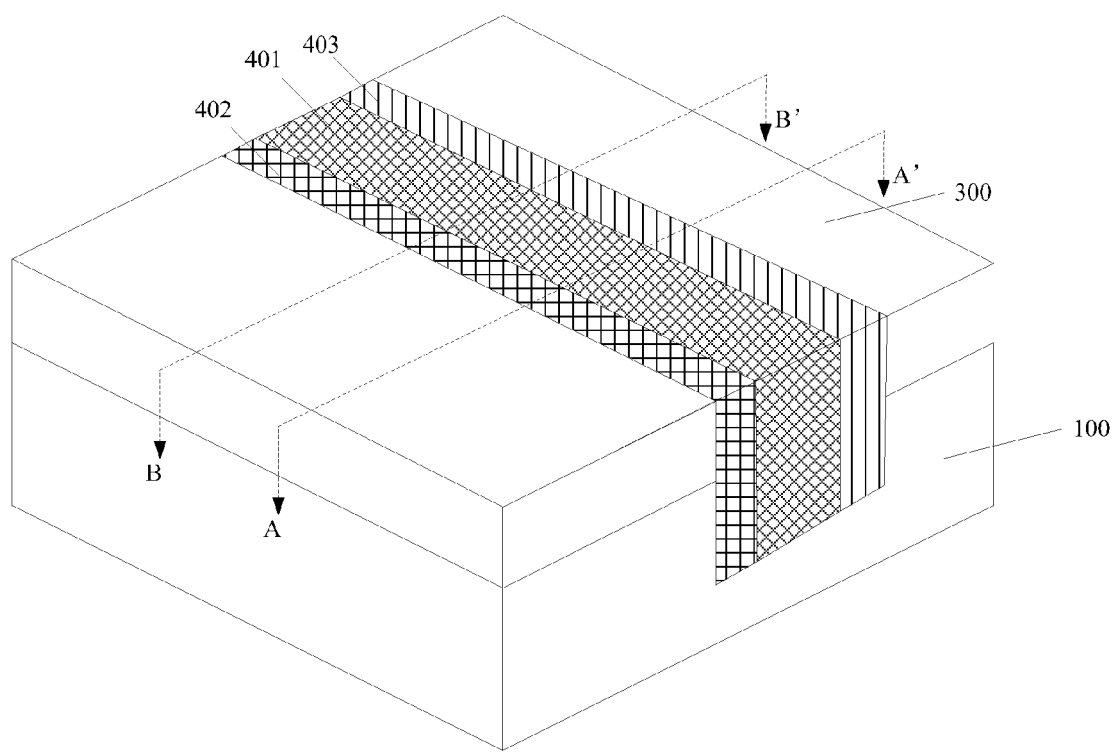
Figure 25:
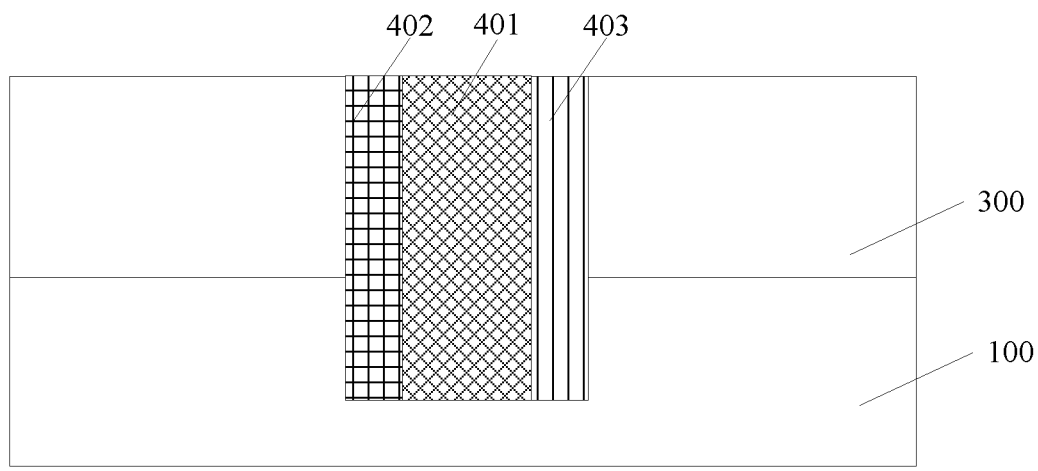
Figure 26:
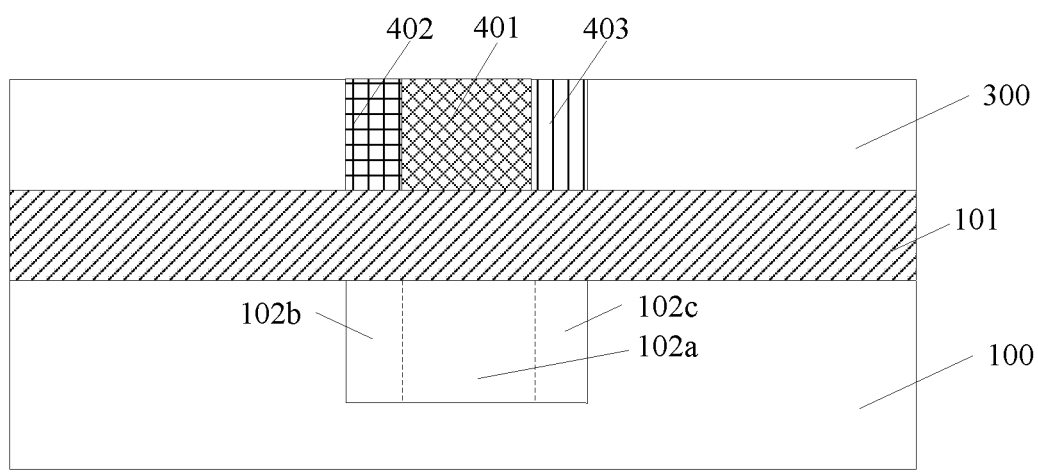

Returning to FIG. 29, after forming the third sub-fins 102*c*, a third metal gate structure may be formed (S112). FIG. 24 illustrates a corresponding semiconductor. FIG. 25 illustrates a cross-sectional view of the structure illustrated in FIG. 24 along the AA' direction. FIG. 26 illustrates a cross-sectional view of the structure illustrated in FIG. 24 along the BB' direction. The BB' direction is parallel to the longitudinal direction of the hard mask layer 101; and on the hard mask layer 101.

As illustrated in FIGS. 24~26, a third metal gate structure 403 is formed in the third trench 303 (as shown in FIG. 22). The third metal gate structure 403 may fill the third trench 303. The third metal gate structure 403 may cross over the hard mask layer 101 and the third sub-fins 102*c* in the third trench 303, and cover the side surfaces of the third sub-fins 102*c* and the side and the top surfaces of the hard mask layer 101.

The third metal gate structure 403 may include a third gate dielectric layer (not labeled) and a third metal gate (not labeled) formed on the surface of the third gate dielectric layer. The third gate dielectric layer may be made of a high-K dielectric material, such as hafnium oxide, zirconia oxide, lanthanum oxide, aluminum oxide, and hafnium silicon oxide, etc. The third metal gate may usually be made of metal material, such as gold, silver, aluminum, tungsten, or titanium, etc. In one embodiment, the third gate dielectric layer is made of hafnium oxide; and the third metal gate is made of aluminum.

In one embodiment, the third metal gate structure 403 may cross over the two third sub-fins 102*c* simultaneously; and cover the side surfaces of the third sub-fins 102*c*. The side surfaces of the third sub-fins 102*c* may be used as portions of the channel regions of the FinFET; and may be controlled by the third metal gate structure 403. The turn-on threshold voltage and the switching frequency of the channel regions located on the side surfaces of the third sub-fins 102*c* may be affected by the work function of the third metal gate structure 403 and other parameters.

In one embodiment, the third metal gate material of the third metal gate structure 403 may be different from the first metal gate material of the first metal gate structure 401 and the second metal gate material of the second metal gate structure 402. Thus, the third metal gate structure 403, the first metal gate structure 401 and the second metal gate structure 402 may have different work functions and different control abilities to the corresponding channel regions. The third metal gate material of the third metal gate structure 403, the second metal gate material of the second metal gate structure 402 and the first metal gate material of the first metal gate structure 401 may be adjusted according to the performance requirements of the semiconductor device.

The method for forming the third metal gate structure 403 may include forming a third gate dielectric material layer on the inner surfaces the third trench 303, and on the first metal gate structure 401, the second metal gate structure 402 and the dielectric layer 300; forming a third metal gate material layer to fill the third trench 303 and on the surface of the third gate dielectric material layer; and planarizing the third metal gate material layer and the third gate dielectric material layer using the dielectric layer 300 as a stop layer. Thus, the third metal gate structure 403 may be formed in the third trench 303. The top surface of the third metal gate structure 403 may level with the top surface of the dielectric layer 300.

The third gate dielectric material layer may be formed by any appropriate process, such as a CVD process, a PVD process, or an FCVD process. The third metal gate material layer may be formed by any appropriate process, such as a PVD process, a sputtering process, or an electroplating process. The third gate dielectric material layer and the third metal gate material layer may be planarized by any appropriate process, such as a CMP process, etc.

The first sub-fins 102*a*, the second sub-fins 102*b*, and the third sub-fins 102*c* may be configured as the fins of the FinFET. The first metal gate structure 401, the second metal gate structure 402, and the third metal gate structure 403 may be configured as the metal gate structures of the FinFET. Further, the first metal gate structure 401, the second metal gate structure 402, and the third metal gate structure 403 may cover side surfaces of the first sub-fins 102*a*, the second sub-fins 102*b*, and the third sub-fins 102*c*, respectively; and may control the portions of the channel regions on the side surfaces of the first sub-fins 102a, the second sub-fins 102b, and the third sub-fins 102c, respectively. The first metal gate structure 401, the second metal gate structure 402, and the third metal gate structure 403 may use different metals as the metal gate materials. Thus, the first metal gate structure 401, the second metal gate structure 402, and the third metal gate structure 403 may have different work functions. Accordingly, the control ability of the gate structures to the channel regions may be enhanced; and the source-drain leakage current may be decreased. Thus, the performance of the FinFET structure at high frequency may be improved.

Figure 27:
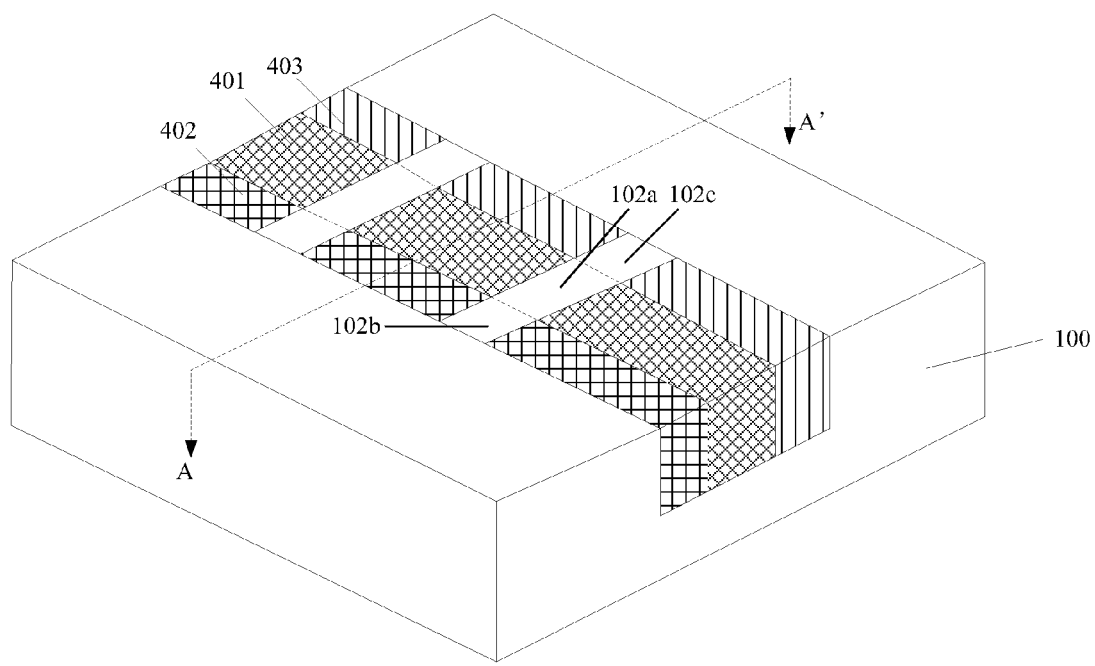

Optionally or additionally, as shown in FIGS. 27~28, after forming the third gate structure 403, a planarization process may be performed on the dielectric layer 300 (referring to FIG. 24), the first metal gate structure 401, the second metal gate structure 402, the third metal gate structure 403 and the hard mask layer 101 (referring to FIG. 26) using the surface of the semiconductor substrate 100 as a stop layer to remove the mask layer 101 and the dielectric layer 300 and the top portions of the first metal gate structure 401, the second metal gate structure 402 and the third metal gate structure 403. Thus, the surface of the semiconductor substrate 100 and the top surfaces of the remaining first metal gate structure 401, the remaining second metal gate structure 402 and the remaining third metal gate structure 403 may be exposed.

Further, the top surfaces of the first sub-fins 102a, the second sub-fins 102b and the third sub-fins 102c may also be exposed. The portions of the semiconductor substrate 100 at two sides of the first sub-fins 101, the second sub-fins 102b and the third sub-fins 102c, and the remaining first metal gate structure 401, the second metal gate structure 402 and the third metal gate structure 403 may be configured as the source regions and the drain regions of the FinFET. Exposing the top surfaces of the semiconductor substrate 100, the first sub-fins 101, the second sub-fins 102b and the third sub-fins 102c may facilitate to subsequently form metal interconnect structures on the source regions and the drain regions and the remaining first metal gate structure 401, the second metal gate structure 402 and the third metal gate structure 403.

The planarization process may be any appropriate process, such as a CMP process, etc. In certain other embodiments, the planarization process may be omitted.

Thus, a FinFET structure may be formed by the above disclosed processes and methods; and FIGS. 24~26 illustrate a corresponding FinFET structure. FIG. 25 is the cross-sectional view of the FinFET structure illustrated in FIG. 24 along the AA' direction. FIG. 26 is the cross-sectional view of the FinFET structure illustrated in FIG. 24 along the BB' direction.

As shown in FIGS. 24~26, the FinFET structure may include a semiconductor substrate 100; and a plurality of fins including first fins 102a, second fins 102b and third fins 102c formed in the surface of the semiconductor substrate 100. The FinFET structure may also include a hard mask layer 101 with a plurality of long stripes formed the top surfaces of the fins; and metal gate structures including a first metal gate structure 401, a second metal gate structure 402 and a third metal gate structure 403 formed on the side surfaces of the plurality of fins and the side and top surfaces of the hard mask layer 101.

Further, the FinFET structure may include a dielectric layer 300 with a top surface level with the top surfaces of the first metal gate structure 401, the second metal gate structure 402 and the third metal gate structure 403 formed on the surface of the semiconductor substrate 100. The dielectric layer 300 may also cover the hard mask layer 101 and the side surfaces of the second metal gate structure 402 and the third metal gate structure 403. Further, the FinFET structure may also include source regions and drain regions (not shown) formed in the semiconductor substrate 100 at two sides of the metal gate structures, respectively. The detailed structures and intermediate structures are described above with respect to the fabrication processes.

Thus, according to the disclosed embodiments, a hard mask layer may be formed on a semiconductor substrate; and a dummy gate structure crossing over the hard mask layer may be formed on the semiconductor substrate. The dummy gate structure may include a dummy gate, and a first sidewall spacer and a second sidewall spacer formed on both sides of the dummy gate. Further, a dielectric layer may be formed on the surface of the semiconductor substrate and level with the top surface of the dummy gate structure. After the dummy gate is removed, a first trench may be formed; and first sub-fins may be formed by etching the semiconductor substrate. Then, a first metal gate structure may be formed in the first trench. After the first sidewall spacer is removed, a second trench may be formed; and second sub-fins may be formed by etching the semiconductor substrate. Then, a second metal gate structure may be formed in the second trench. After the second sidewall spacer is removed, a third trench may be formed; and third sub-fins may be formed by etching the semiconductor substrate. Then, a third metal gate structure may be formed in the third trench as well. Thus, the metal gate structures of the FinFET formed by such a method may include the first metal gate structure, the second metal gate structure and the third metal gate structure. Accordingly, the control ability of the metal gate structure to the channel regions of the FinFET may be improved; and the performance of the FinFET structure may be enhanced.

Further, the first metal gate structure may include a first gate dielectric layer and a first metal gate formed on the surface of the first gate dielectric layer. The second metal gate structure may include a second gate dielectric layer and a second metal gate formed on the surface of the second gate dielectric layer. The third metal gate structure may include a third gate dielectric layer and a third metal gate formed on the surface of the third gate dielectric layer. The first metal gate, the second metal gate and the third metal gate may be made of different metals. Thus, the first metal gate structure, the second metal gate structure and the third metal gate structure may have different work functions. Accordingly, the control ability of the gate structure to the channel regions may be enhanced; and the source-drain leakage current may be reduced. Thus, performance of the FinFET structure at high frequency may be improved.

Further, the method for removing the first sidewall spacer or the second sidewall spacer may include doping the first sidewall spacer or the second sidewall spacer with hydrogen ions or helium ions; and followed by a wet etching process. Hydrogen fluoride solution may be used as the etching solution in the wet etching process. The number of N—H bond may be increased in the first sidewall space or the second sidewall spacer with the doping of hydrogen ions or helium ions. Further, the Si—N bonds in the first sidewall spacer or the second sidewall spacer may be broken to accelerate the etching of the first sidewall spacer or the second sidewall spacer in the hydrogen fluoride solution. Thus, the hydrogen fluoride solution may be used for the wet etching of the first sidewall spacer and the second sidewall spacer to avoid the use of a phosphate solution; and the particle contamination issue and the safety issue caused by the phosphate solution well may be avoided.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a Fin field-effect transistor structure, comprising:
    providing a semiconductor substrate;
    forming a hard mask layer on the semiconductor substrate;
    forming a dummy gate structure having a dummy gate, a first sidewall spacer and a second sidewall spacer crossing over the hard mask layer on the semiconductor substrate; wherein forming the dummy gate structure further comprises: forming a dummy gate material layer covering the hard mask layer on the semiconductor substrate;
    patterning the dummy gate material layer to form the dummy gate crossing over the hard mask layer;
    forming a sidewall spacer material layer on the semiconductor substrate, the dummy gate and the mask layer;
    etching the sidewall spacer material layer to form the first sidewall spacer and the second sidewall spacer on two side surfaces of the dummy gate;
    removing the dummy gate to form a first trench to expose the hard mask layer;
    forming first sub-fins in the semiconductor substrate under the hard mask layer;
    forming a first metal gate structure in the first trench;
    removing the first sidewall spacer to form a second trench to expose the hard mask layer;
    forming second sub-fins in the semiconductor substrate under the hard mask layer;
    forming a second metal gate structure in the second trench;
    removing the second sidewall spacer to form a third trench to expose the hard mask layer;
    forming third sub-fins in the semiconductor substrate under the hard mask layer; and
    forming a third metal gate structure in the third trench.

2. The method according to claim 1, wherein:
    the dummy gate material layer is made of one of photoresist, polysilicon, amorphous silicon and amorphous carbon.

3. The method according to claim 1, wherein:
    the dummy gate material layer is formed by a spin-coating process.

4. The method according to claim 1, wherein:
    the first sidewall spacer is made of one of silicon nitride and silicon oxide; and
    the second sidewall spacer is made of one of silicon nitride and silicon oxide.

5. The method according to claim 1, wherein forming the dielectric layer further comprises:
    forming a dielectric material layer covering the hard mask layer and the dummy gate structure on the semiconductor substrate; and
    planarizing the dielectric material layer using the dummy gate structure as a stop layer to form the dielectric layer, wherein a top surface of the dielectric layer levels with the top surface of the dummy gate structure.

6. The method according to claim 1, after forming the dummy gate structure, further comprising:
    performing a source and drain ion implantation process on the semiconductor substrate at two sides of the dummy gate structure to form a source region and a drain region in the semiconductor substrate at two sides of the dummy gate structure, respectively.

7. The method according to claim 1, wherein:
    the dummy gate structure is removed by one of a wet etching process and a plasma ashing process.

8. The method according to claim 1, wherein removing the first sidewall spacer and the second sidewall spacer further comprises:
    performing an ion implantation process with one of hydrogen ions and helium ions on the first sidewall spacer and the second sidewall spacer; and
    removing the doped first sidewall spacer and the doped second sidewall spacer by a wet etching process using a hydrogen fluoride solution as an etching solution.

9. The method according to claim 8, wherein:
    the ion implantation process is a capacitive-coupled plasma ion implantation process;
    a bias source power of the capacitive-coupled plasma is in a range of approximately 0 W~500 W;
    a pressure of the capacitive-coupled plasma is in a range of approximately 25 mTorr~80 mTorr; and
    a mass concentration of the hydrogen fluoride solution is in a range of approximately 0.5%~2%.

10. The method according to claim 1, further comprising:
    planarizing the dielectric layer, the first metal gate structure, the second metal gate structure, the third metal gate structure and the hard mask layer using the surface of the semiconductor substrate as a stop layer to remove the dielectric layer, a top portion of the first metal gate structure, a top portion of the second metal gate structure, a top portion of the third metal gate structure and the hard mask layer to expose top surfaces of remaining first metal gate, remaining second metal gate and remaining third metal gate.

* * * * *